United States Patent [19]

Hinks

[11] Patent Number: 4,761,613

[45] Date of Patent: Aug. 2, 1988

[54] MONITORED ECHO GATING FOR THE REDUCTION OF MOTION ARTIFACTS

[75] Inventor: Richard S. Hinks, Miami, Fla.

[73] Assignee: Picker International, Inc., Highland Hts., Ohio

[21] Appl. No.: 84,683

[22] Filed: Aug. 12, 1987

[51] Int. Cl.$^4$ .......................................... G01R 33/20
[52] U.S. Cl. .................... 324/309; 324/307
[58] Field of Search ............... 324/300, 307, 312, 313, 324/314, 309, 318, 322; 128/653

[56] References Cited

U.S. PATENT DOCUMENTS

| | | | |
|---|---|---|---|
| 4,321,537 | 5/1982 | Yokokawa et al. | 324/312 |
| 4,439,733 | 3/1984 | Hinshaw et al. | 324/322 |
| 4,545,384 | 10/1985 | Kawachi | 128/653 |
| 4,567,893 | 2/1986 | Charles et al. | 128/653 |
| 4,581,582 | 4/1986 | Redington | 324/309 |
| 4,591,789 | 5/1986 | Glover | 324/307 |
| 4,614,195 | 9/1986 | Bottomley et al. | 128/653 |
| 4,616,183 | 10/1986 | Glover et al. | 324/309 |
| 4,618,827 | 10/1986 | Redington et al. | 324/309 |
| 4,649,346 | 3/1987 | Young et al. | 324/309 |
| 4,654,593 | 3/1987 | Ackerman | 324/307 |
| 4,678,996 | 7/1987 | Haacke | 324/309 |
| 4,682,110 | 7/1987 | Boef | 324/309 |
| 4,683,433 | 7/1987 | Yamamoto | 324/309 |
| 4,684,890 | 8/1987 | Briguet | 324/309 |
| 4,684,891 | 8/1987 | Feinberg | 324/309 |
| 4,701,706 | 10/1987 | Haacke | 324/309 |
| 4,710,717 | 12/1987 | Pelc | 324/309 |
| 4,716,368 | 12/1987 | Haacke | 324/309 |

FOREIGN PATENT DOCUMENTS 0122593 10/1984 European Pat. Off. .
0167350 8/1986 European Pat. Off. .

OTHER PUBLICATIONS

"Suppression of Respiratory Motion Artifacts in Magnetic Resonance Imaging", by Wood, et al., Med. Phys. 13(6), Nov./Dec. 1986, pp. 794-805.
"Artifact Suppression Technique (MAST) for MR Imaging", by Pattany, et al., J. Comput. Assist. Tomogr., vol. 11, No. 3, 1987, pp. 369-377.
"Ring Resonator RF-Probes for Proton Imaging Above 1 Telsa", by P. Roschmann, Philips GmbH Forschungslaboratorium Hamburg, D2, Hamburg, 54, FRG, pp. 634-635.
"Quadrature Detection Coils-A Further 2 Improvement in Sensitivity", by Chen, et al., J. Mag. Res. 54, (1983), pp. 324-327.
"An Effective DeCoupler Coil Design which Reduces Heating in Conductive Samples in Superconducting Spectrometers", by Alderman, et al., J. Mag. Res. 36, (1979), pp. 447-451.
Patent Application Ser. No. 798,551 filed Nov. 15, 1985, by Haacke, et al., (allowed Aug. 18, 1987).

Primary Examiner—Michael J. Tokar
Attorney, Agent, or Firm—Fay, Sharpe, Beall, Fagan, Minnich & McKee

[57] ABSTRACT

A transmitter (30) and a gradient field control (20) apply radio frequency excitation and refocusing pulses and magnetic field gradients across an image region to induce pairs of phase encoded magnetic resonance signals. One of the magnetic resonance signals is phase encoded with a preselected reference phase encoding. The other is phase encoded with one of a plurality of image phase encodings. A receiver (34) receives the magnetic resonance signals which are digitized by an analog-to-digital converter (36) to produce a digital monitor view for storage in a monitor view memory or latch (56) and an image view for storage in an image view memory or latch (90). Views encoded with the reference phase encoding are either collected before the imaging sequence or derived from a plurality of collected monitor views to provide a reference view for storage in a reference view memory (54). As each pair of monitor and image views are received, the deviation between the monitor view and the reference view is determined (58). Based on the deviation, the image view is accepted or rejected. If the image view is rejected, a new paired monitor and image view may be generated and the process repeated. Alternately, adjacent views may be interpolated to provide a substitute view. The image views are Fourier transformed (96) into an image memory (98) from which an image may be displayed on a video monitor (100).

21 Claims, 4 Drawing Sheets

MONITORED ECHO GATING FOR THE REDUCTION OF MOTION ARTIFACTS

BACKGROUND OF THE INVENTION

The present invention relates to the art of data verification. It finds particular application in conjunction with magnetic resonance imaging and will be described with particular reference thereto. However, it is to be appreciated that the invention may also find application in other types of data acquisition and handling processes, including magnetic resonance spectroscopy, medical diagnostic imaging, and the like.

Heretofore, patient motion has been a major cause of image degradation in magnetic resonance imaging. Patient motion causes streaking or ghosting in the phase encode direction, loss of resolution, blurring, and the like. Ghosting in the phase encoding direction is often attributable to periodic errors or motion; whereas, streaking is often attributable to random errors.

In one common magnetic resonance imaging technique, a magnetic resonance excitation or 90° RF pulse is applied to excite magnetic resonance of selected dipoles in an image slice or region. An additional pulse or pulses, such as a 180° RF inversion pulse, is applied to induce the resonating nuclei to converge and form a magnetic resonance echo. Phase encode and read gradient pulses are applied for phase and frequency encoding the magnetic resonance data along orthogonal phase encode and frequency encode axes or directions in the selected slice region. During each magnetic resonance echo, resonance data are collected and digitized to form one view or line of magnetic resonance data. The sequence is repeated with each of a plurality of different phase encode gradients. The set of views with one corresponding to each of the plurality of phase encodings is Fourier transformed to form an image representation.

The artifacts are attributable to the difference between a view collected during motion and the same phase encoded view collected in the absence of motion. If the subject moves to a different location in the frequency encode direction, each view has different frequency components. Physical displacement and motion in the direction of the phase encode gradient both result in changes of the phase of the acquired data values of the resultant view. Further, the movement of non-saturated spins into or out of the image slice causes changes in amplitude of the data values of the resultant view.

As an object moves through magnetic field gradients, its resonant dipoles accumulate phase shifts which are directly related to associated orders of motion, e.g. velocity, acceleration, pulsatility, or the like. If the nature of the motion changes from view to view, even although the physical position remains constant at the time of data collection, the phase of the resultant view will change. Also, the amplitude, phase, and frequency spectrum of the resultant view are altered by motion into or out of the image slice. As partially saturated material in the slice is replaced by non-saturated material from out of the slice, amplitudes increase. In multi-slice imaging, partially saturated material may move from slice to slice causing an amplitude increase or decrease in a given slice. As an object moves relative to a radio frequency coil, the coil loading and the coil tuning may change. This alters the sensitivity of the receiver and changes the effective flip angles. Motion toward or away from a surface coil changes the intensity of the signal which is received, even without net changes in coil tuning. Any or all of these mechanisms may contribute to data errors and hence, to motion artifacts.

The prior art techniques for reducing or eliminating the effects of motion can be divided into three categories—gating, modified pulse sequences, and modified data collection techniques. In the prior art gating techniques, an external monitor monitored the patient's motion. The collection of data or the application of pulse sequences was blocked when an unacceptable degree of motion or displacement was detected. Analogously, a state of motion could be frozen by triggering a pulse sequence in response to monitoring a preselected state of motion. One of the problems with the prior art gating techniques is that the monitors commonly monitored only physical position. A moving body part, even although nominally in the correct location during data collection, still causes phase errors in the resultant view and also a loss of resolution.

In the modified pulse sequences, motion artifacts were reduced by reducing the sensitivity of the pulse sequence to the effects of motion. Although the modified pulse sequences tended to reduce phase errors, the motion related loss of resolution was not recovered and physical displacement or shifting of the patient to a new stationary location was not detected.

The modified data collection schemes commonly included rearranging the order in which views are collected. The views were collected such that the view number corresponded to a selected location, e.g. in respitory applications, the chest wall position. This rearranging reduces periodic motion-induced ghosts. However, modified data collections schemes neither corrected for the motion nor recovered the lost resolution.

The present invention provides for a new and improved data collection technique in which the collected data is examined for evidence of subject movement during the data collection period.

SUMMARY OF THE INVENTION

In accordance with one aspect of the present invention, a method of magnetic resonance imaging is provided. A reference view is derived which has a preselected, reference phase encoding. A plurality of magnetic resonance excitation and data collection sequences are implemented. At least some of the sequences include phase encoding the magnetic resonance with the reference phase encoding and collecting a monitor view and also phase encoding the resonance with one of a plurality of image phase encodings and collecting a corresponding image view. Each monitor view is compared with the reference view to assess motion of the corresponding image view.

In accordance with a more limited aspect of the present invention, the reference view is derived before commencement of the scan by applying one or more resonance excitation and data collection sequences with the reference phase encoding. A single view might be collected while the subject is observed to be stationary or a plurality of like views might be collected and combined.

In accordance with another aspect of the present invention, the reference view is derived from the plurality of monitor views collected during the imaging sequence. The reference view may be derived by averaging the monitor views, averaging selected monitor views, such as those with the least deviation from each other, selecting a median monitor view, or the like.

In accordance with another more limited aspect of the present invention, two or more complete sets of monitor and image views are collected. The monitor views corresponding to each phase encoding are compared with the reference view to determine which matches it most closely. Based on the conformity between the monitor and reference views, selected image views are transformed into the image representations. Each selected image view may be an average of two or more like phase encoded image views, or the image view corresponding to the monitor view with the least deviation from the reference view.

In accordance with yet another aspect of the invention, a method of medical diagnostic imaging is provided. A subject is non-invasively examined to derive a plurality of pairs of digital electronic monitor and image views. Each pair is collected generally contemporaneously. Each monitor view is compared with a reference view to determine a degree of deviation therebetween. In accordance with the deviation, the corresponding image view is either accepted or rejected. The accepted image views are processed into an image representation.

In accordance with another aspect of the present invention, an apparatus is provided which has means for performing each step of the above referenced magnetic resonance imaging method.

One advantage of the present invention is that it eliminates external motion monitoring equipment.

Another advantage of the present invention is that it identifies questionable image data to enable appropriate compensation to be made.

Yet another advantage of the present invention is that it provides for true motion artifact removal rather than merely averaging or blurring of motion artifacts.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps or in various components and arrangements of components. The drawings are merely for purposes of illustrating preferred embodiments and are not to be construed as limiting the invention.

DETAILED DESCRIPTION OF THE PREFERRED EMBODIMENTS

Figure 1:
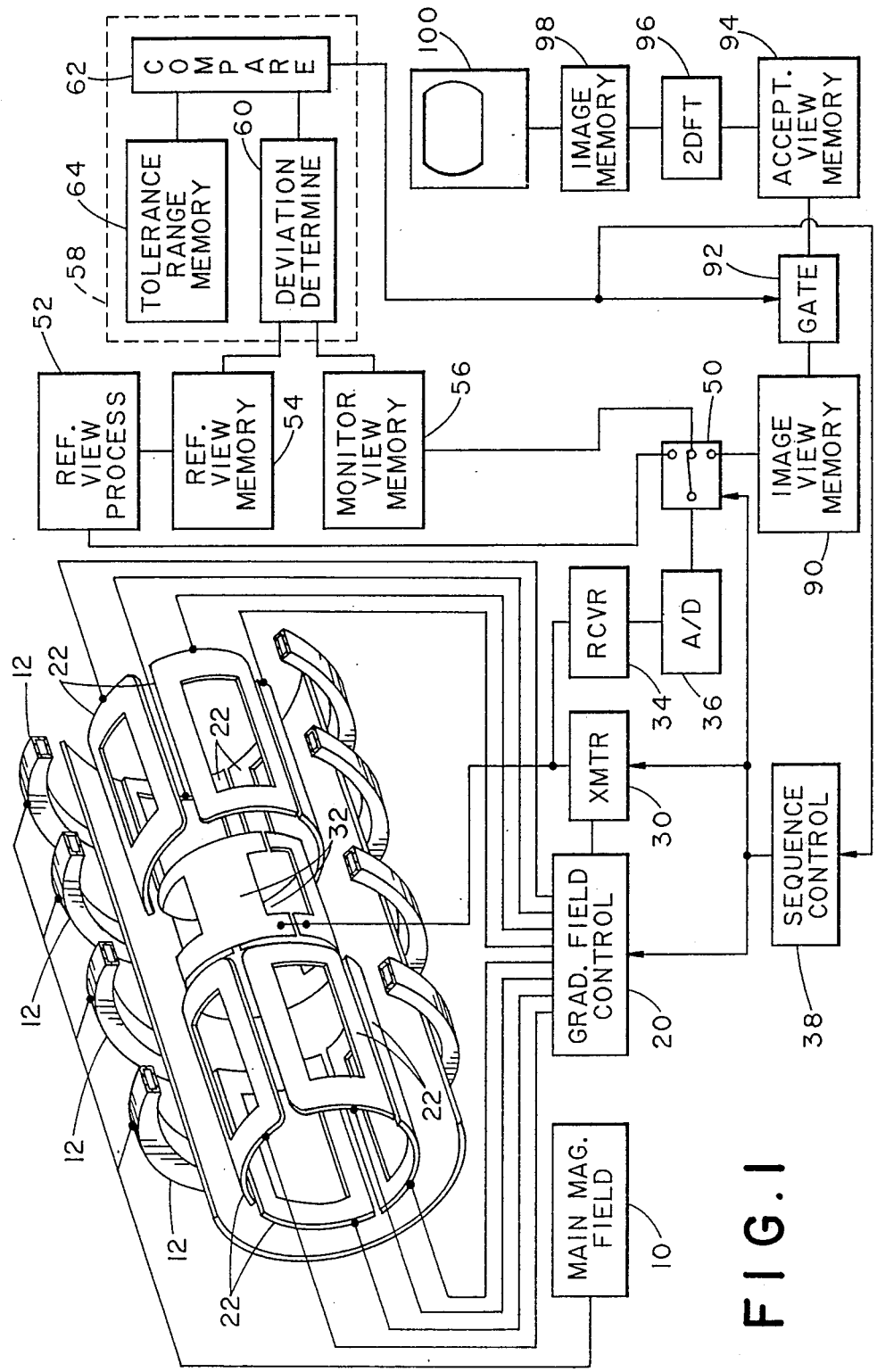
FIG. 1 is a block diagram of a magnetic resonance imaging apparatus in accordance with the present invention.

With reference to FIG. 1, dipoles in an image region of a magnetic resonance imaging apparatus are excited to magnetic resonance. More specifically, a main magnetic field means including a main magnetic field controller 10 and a plurality of electromagnets 12, generates a substantially uniform, main magnetic field through the image region. A gradient field control means 20 selectively controls the application of gradient fields across the main magnetic field by gradient field coils 22. Slice select gradients are caused by selectively applying current pulses to the gradient field coils to define an image plane which may extend orthogonal or oblique to the main magnetic field. Phase encode and read gradients are selectively caused along mutual orthogonal axes in the slice by selectively applying current pulses to appropriate gradient field coils. The slice select gradients define an image slice(s) or region. The phase encode and read gradients encode the phase and frequency of the magnetic resonance along mutual orthogonal axes within the slice. Multi-slice and three dimensional imaging may also be practiced by applying other appropriate, known current pulse patterns to the gradient coils.

A transmitter 30 selectively applies radio frequency pulses to radio frequency coils 32. Radio frequency pulses are tailored to excite magnetic resonance in the image region and to manipulate and orient the magnetization of the resonating dipoles. Magnetic resonance signals generated by the resonating dipoles, particularly when the magnetization is refocused into an echo, are received by the RF coils 32. Alternately, separate transmit and receive coils may be provided. A radio frequency receiver 34 demodulates the received radio frequency magnetic resonance signals to a bandwidth of $f_0 \pm \Delta f$, where the center frequency $f_0$ of the bandwidth or spectrum $\pm \Delta f$ is preferably zero.

The received magnetic resonance signals are digitized by an analog-to-digital converter 36. The digitized signals collected during each echo are denoted as a view or line of data. Preferably, a quadrature detection technique is utilized such that each digital data value of the view has real and imaginary components. A timing and control means 38 controls the timing and application of the gradient and radio frequency pulses to perform spin echo, gradient echo, inversion recovery, and other imaging sequences as are well known in the art.

Figure 2:
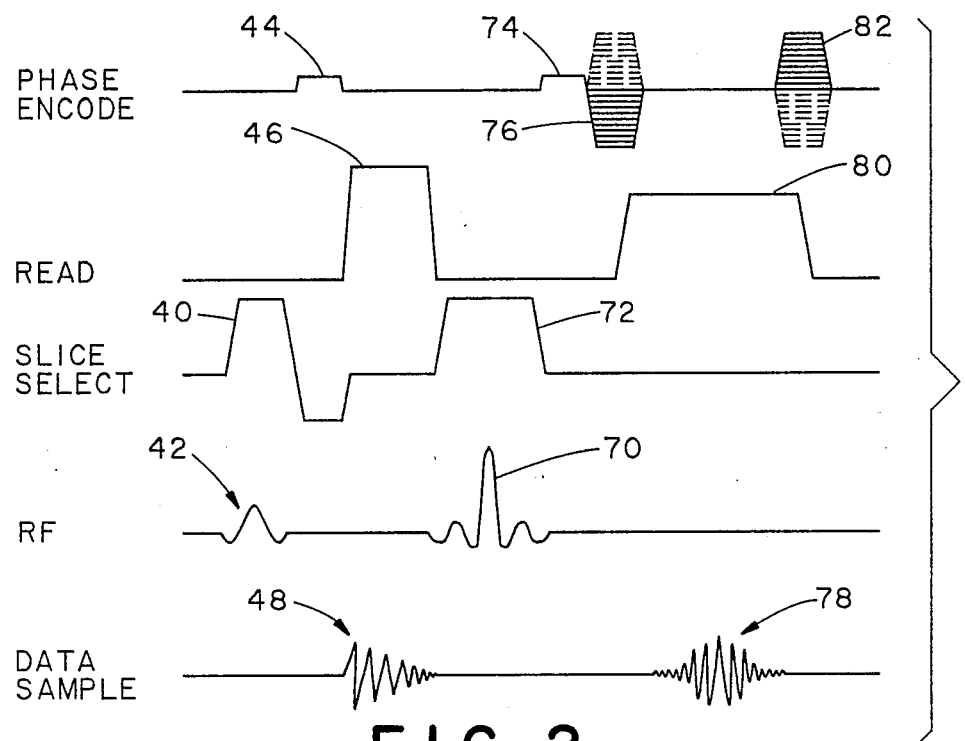
FIG. 2 is an exemplary pulse sequence in accordance with the present invention.

With reference to FIG. 2, in a single slice spin echo imaging sequence, for example, the gradient field control means 20 applies a slice select gradient 40 along the main magnetic field. Concurrently, the transmitter 30 generates a radio frequency magnetic resonance excitation pulse 42 to excite magnetic resonance about a preselected central frequency in the selected slice. To derive a reference view, the gradient field control means applies a phase encode gradient 44 with the preselected reference phase encoding. The gradient control means further applies a read gradient 46 as the magnetic resonance signal or echo 48 is monitored. Each sequence is extended as described below in conjunction with resonance data acquisition to maintain a proper steady state during the reference view collection.

In the embodiment of FIG. 1, the timing and control means 38 causes a switch means 50 to direct the received view to a reference view processing means 52. In the preferred embodiment, the reference view processing means includes an averaging means for averaging a plurality of views each generated in accordance with the above described pulse sequence with the reference phase encoding. Alternately, the reference view processing means may perform a statistical analysis, weighted averaging, median value determination, or the like. Optionally, a motion monitor may be connected with the processing means such that views collected while the patient was moving are discarded. The reference view is stored in a reference view memory means 54.

With the patient still in the same position, an imaging pulse sequence is initiated. With reference again to FIG. 2, each imaging pulse sequence includes the concurrent application of the slice selection gradient 40 and the resonance excitation pulse 42. The phase encode gradient pulse 44 encodes the magnetic resonance with the same phase encoding as the reference view stored in reference view memory 54. The read gradient 46 is applied as a monitor echo is received by the receiver 34.

Referring back to FIG. 1, the timing and control means 38 causes the switch means 50 to direct the view digitized from the monitor echo to a monitor view memory means 56. A comparing means 58 includes a deviation determining means that compares the reference and monitor views to determine the deviation therebetween. More specifically, the comparing means compares the amplitude of the real and imaginary components of the corresponding digital values of the monitor and reference views. Commonly, there are about 128 to 512 complex data values per view. Preferably, a statistical analysis is performed on the deviations between the corresponding amplitudes of the reference and monitor views to provide an indication of the degree of similarity or deviation. Alternately, the statistical analysis may be performed on the Fourier transforms of the monitor and reference views. The comparing means further includes a limit comparing means 62 that compares the deviation value with a preselected deviation range or tolerance stored in a tolerance memory means 64. The acceptable tolerance range is selected in accordance with how still or motion free the subject should be for the procedure being performed. That is, a wider tolerance range is set for procedures that are less sensitive to motion degradation.

Referring again to FIG. 2, after the monitor view is collected and stored, a 180° RF inversion pulse 70 and a slice select gradient 72 are concurrently applied to the image region. A reference phase decoding gradient 74 is applied to remove the reference phase encoding. An image view phase encode gradient 76, which can assume any one of a preselected multiplicity of phase encodings, applies an image phase encoding. An image echo 78 is received by the receiver 34 concurrently with the application of a read gradient 80. Another phase encode gradient 82 removes the image phase encoding in preparation for the next sequence. As is conventional, the image phase encode gradient changes in steps from pulse sequence to pulse sequence from a minus maximum phase encoding through a zero phase encode to a positive maximum phase encoding. Commonly, the image phase encode gradient assumes each of 128 to 256 values. Alternately, about half of the views may be collected and the other half may be derived from the conjugate symmetric nature of the collected data.

With reference again to FIG. 1, the digitized imaged view is channeled by the switch means 50 to an image view memory or latch means 90. A gate means 92 under the control of the comparing means 58 determines whether or not the received image view is passed to a view memory 94 or discarded. If the view is discarded, the timing and control means cause another monitor and image view pair with the same image view phase encoding to be collected. This process may be repeated until the monitor and reference views deviate with less than the preselected tolerance range, i.e. an acceptable image view is received. A Fourier transform means 96 transforms the accumulated views to form an electronic image representation for storage in an image memory 98. A video monitor 100 or other display means is provided for viewing the image representation. In this manner, each image view contributes to the resultant image if the corresponding monitor view collected in the same pulse sequence with the reference phase encoding substantially matches the reference view.

In an imaging pulse sequence, the phase of the 90° RF excitation pulse is commonly alternated from view to view. The odd numbered views have one phase and the even numbered views have an opposite phase. Because monitor views of opposite phase are not readily comparable, it is preferable that separate reference views be calculated for each. Each odd monitor view is then compared with the odd reference view and each even monitor view is compared with the even reference view.

It is to be appreciated in the pulse sequence the monitor echo may be generated either before or after the image echo. An advantage of generating the monitor echo first is that it tends to have a higher signal-to-noise ratio which improves the precision with which deviation determination can be made. Similarly, the monitor echo may be collected as a field echo in which the static inhomogeneities are not refocused or as a spin echo in which the static inhomogeneity and chemical shift are refocused. If the monitor echo is the second echo of a dual echo sequence, then partial rephasing of flowing material is achieved which reduces dependence on the phase of a cardiac cycle. It is further to be appreciated that the monitor and reference views might also be created in the presence of a varying or non-constant gradient. It is significant that the conditions are the same for both the monitor and reference echo to provide a basis for comparison. Various non-constant gradients during monitor and echo data sampling may prove advantageous to emphasize more the statistically significant data values in the reference and monitor views, improve the signal-to-noise ratio, or the like.

Figure 3:
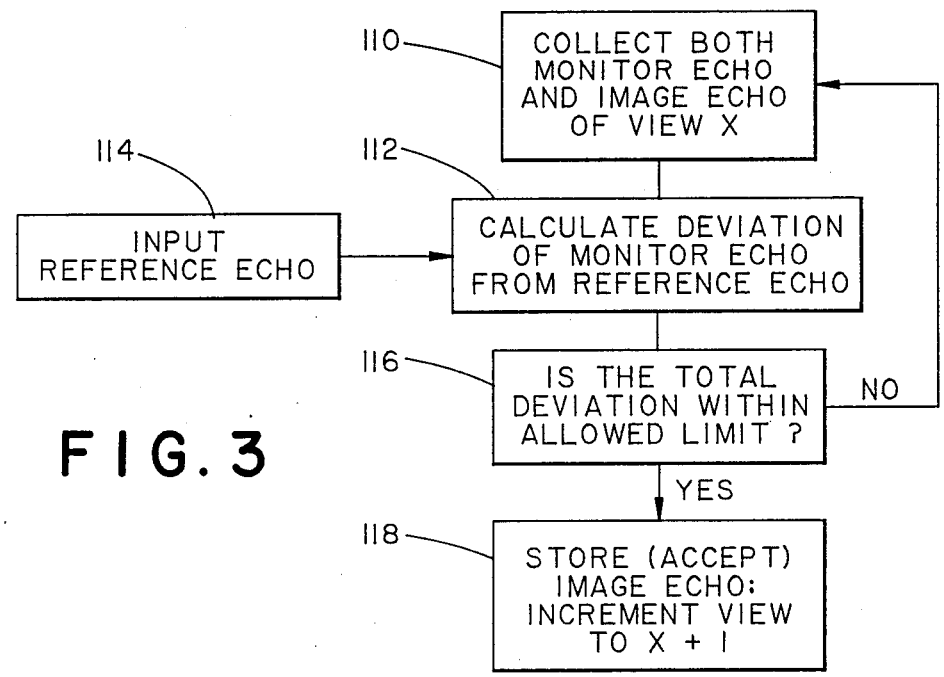
FIG. 3 is a computer flow chart for implementing the data transfer described in conjunction with FIG. 1 in software.

With reference to FIG. 3, it is preferred that the data manipulations described above be carried out in computer software. At step 110, both the monitor view and the image view are collected. At one 112 the deviation is determined between each monitor view and the reference view as read at 114. A comparison step 116 determines whether the monitor and reference views are within the preselected deviation limit or range. If the deviation is outside the acceptable range, the monitor and image views are recollected and the deviation of the repeated views is determined by repeating steps 110, 112, and 116 until the deviation is within the acceptable range. If the deviation is within the acceptable range, then the image view is stored and the timing and control means is incremented at 118. The routine is repeated with the next image and monitor view pair.

Figure 4:
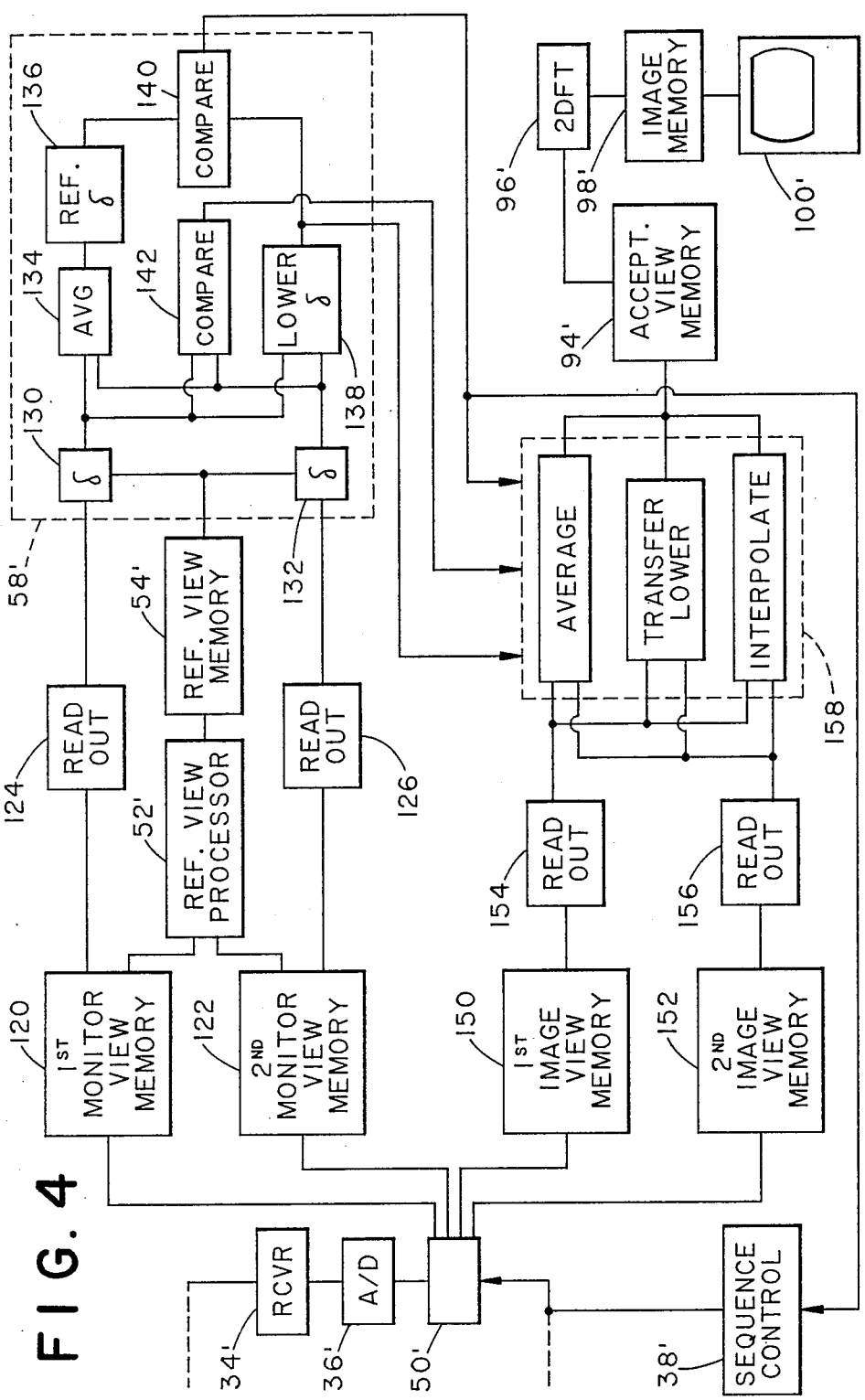
FIG. 4 is a diagrammatic illustration of a magnetic resonance imager in accordance with an alternate embodiment of the present invention; and, FIG. 5 is a computer flow chart for implementing the data manipulations of FIGURE 4 in computer software.

In the alternate embodiment of FIG. 4, like elements of the embodiment of FIGS. 1-3 are denoted with the same reference numeral but followed by a prime ('). Two complete sets of image data are collected and the best or most motion free view from each of the two image data sets is selected. More specifically, the timing and control means 38 causes a series of magnetic resonance excitation pulse sequences such as the series described above in conjunction with FIG. 2. Preferably, two complete image data sets are collected interleaved, i.e. the views for one image set is taken alternately with views for another image set. Optionally, the views of the two scans can be collected serially, one after the other. The monitor views from the first set are collected in a first monitor view memory means 120 and the monitor views from the second view set are stored in a second monitor view memory means 122. Rather than storing only individual views, the monitor view memory means store the full set of monitor views and an indication of the image view to which each corresponds. A reference view processing means 52' averages the stored monitor views from the first and second monitor view memory means to produce a single reference view for storage in a reference view memory means 54'. Optionally, other processing techniques beside averaging may be utilized to select an appropriate reference view. If the odd and even views have different phases, then separate odd and even reference views are derived, each as just described.

View read-out means 124, 126 read out the corresponding monitor views from the first and second view memories. A comparing means 58' includes deviation determining means 130 and 132 for determining the deviation between the reference view and each of the corresponding monitor views. An averaging means 134 averages the deviation between all of the monitor views and the reference view to determine a reference deviation for storage in a reference deviation memory means 136. A lower deviation determining means 138 determines which of the corresponding monitor views deviate the least from the reference view, i.e. has the best match. A degree of deviation comparing means 140 compares the lower deviation with the reference deviation from reference deviation memory means 136 to determine if the lower deviation view is within an acceptable tolerance range. This also determines whether either monitor view of the pair has a low enough deviation to be acceptable. A relative deviation comparing means 142 compares the deviation of the corresponding monitor views with the reference view to determine if both have substantially the same deviation within selected tolerances.

The first image views are accumulated in a first image view memory means 150 and the second image views are stored in a second image view memory means 152. Read-out means 154, 156 read out corresponding image views to an image processing means 158. The image view processing means 158 is controlled by the lower deviation means 138 and the comparing means 140 and 142. More specifically, when the comparing means 142 determines that both corresponding monitor views are acceptably close to each other and the comparing means 140 determines that the lower of the two deviances is acceptably close to the reference deviation, the image view processing means 158 averages the two image views and passes the averaged image view to an acceptable image view memory means 94'.

When the comparing means 142 determines that there is a significant difference in the degree of deviation between the pair of corresponding monitor views and the reference view, the image view processing means 158 transfers the image view corresponding to the lower deviation monitor view as determined by the lower deviation determining means 138. When the comparing means 140 determines that both monitor views deviate unacceptably from the deviation tolerance limits, both corresponding image views are discarded. The image view processing means 158 interpolates the two nearest acceptable image views to create an interpolated replacement view for transfer to the acceptable image view memory means 94'. Alternately, if the patient is still in place, the timing and control means 38' may repeat the corresponding pulse sequence to create a substitute view.

When the two image view sets have been condensed to a single image view set, an inverse two dimensional Fourier transform means 96' Fourier transforms the composite image views to create an image representation for storage in an image memory 98'. The reconstructed image representation may be displayed on a video monitor or other appropriate display means 100', stored on tape or disc, further processed, or the like.

Figure 5:
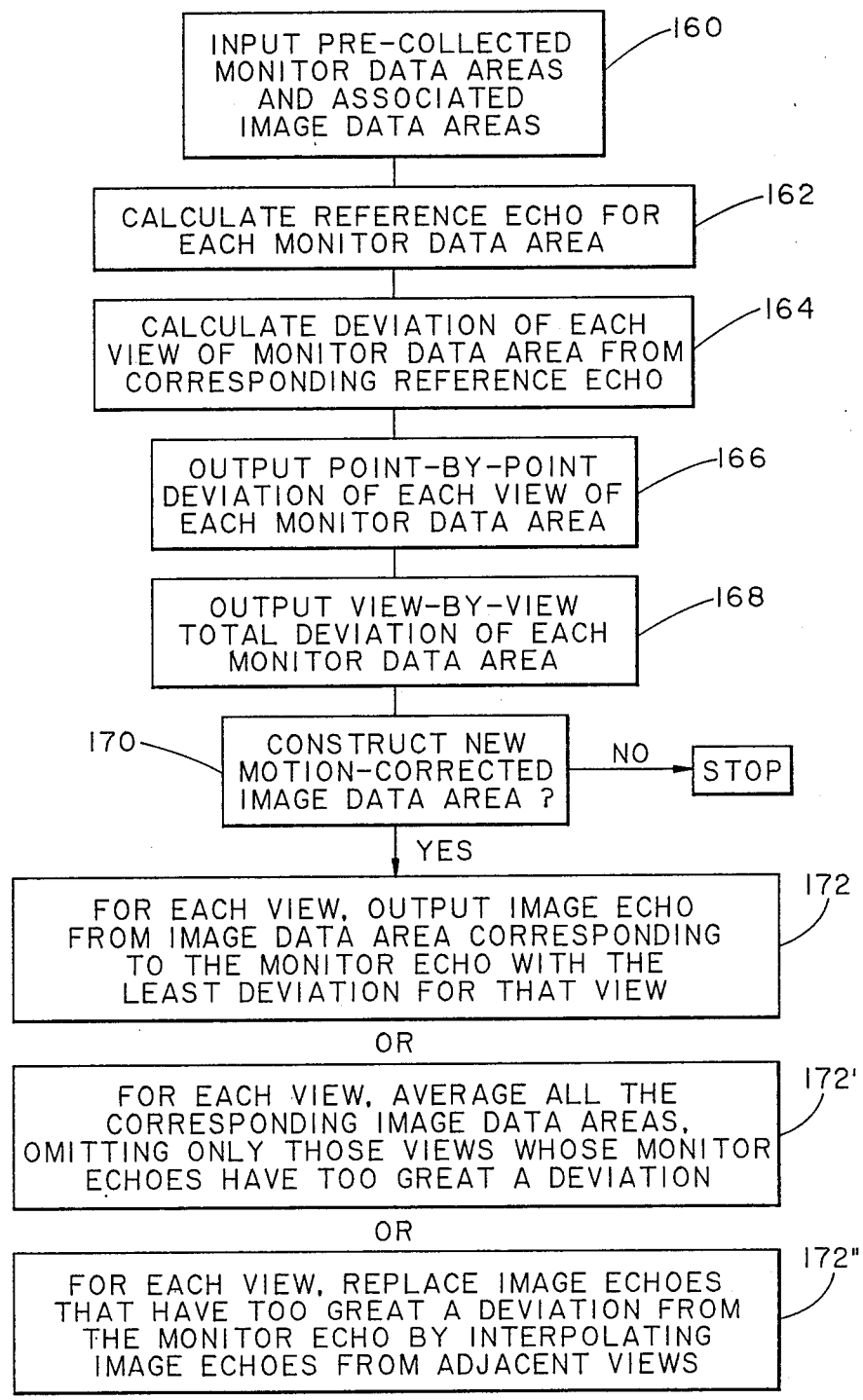

With reference to FIG. 5, the deviation comparison steps discussed above are preferably implemented in computer software. FIG. 5 illustrates a preferred data analysis flow chart for performing this analysis after data collection has been completed. At 160, the corresponding monitor and image views are input to computer memory. At 162, a pair of reference views are calculated—one corresponding to each set of monitor views. Again, if the odd and even views have different phases due to phase alternation of the RF excitation pulse, odd and even reference views are separately processed. At 164, the deviation between each monitor view and its corresponding reference view are determined. At 166, the deviation between each of the real and imaginary components of each data value of the monitor and reference views is determined. At 168, the point by point deviations are summed to determine the deviation between the reference and monitor views. At 170, the view deviation is compared with preselected tolerance range to determine whether the deviations between the reference and monitor views are within acceptable tolerances. If they are, at one 172, the image view which corresponds to the monitor view that deviates the least from its corresponding reference view is designated for use in the Fourier transform image reconstruction. Optionally, at step 172', both corresponding image views may be averaged in all instances except those in which one or both of the corresponding monitor views deviate from the reference view by more than acceptable tolerances. If neither view is within the acceptable tolerance of the reference view, in step 172" both are discarded and are replaced by interpolating the closest adjoining acceptable views.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A method of magnetic resonance imaging comprising:
   deriving a reference view having a first preselected phase encoding;
   initiating a plurality of magnetic resonance excitation and data collection pulse sequences, at least some of the pulse sequences including:
   phase encoding magnetic resonance with the preselected reference phase encoding and collecting a monitor view with the reference phase encoding, and,
phase encoding the magnetic resonance with one of a plurality of image phase encodings and collecting an image view;
comparing each monitor view with the reference view to assess validity of the corresponding image view.

2. The method as set forth in claim 1 wherein the step of deriving the reference view includes:
exciting magnetic resonance;
phase encoding the magnetic resonance with the reference phase encoding;
receiving a magnetic resonance signal encoded with the reference phase encoding; and,
converting the received magnetic resonance signal to the reference view.

3. The method as set forth in claim 2 wherein the step of receiving the magnetic resonance signal includes quadrature detecting the magnetic resonance signal and wherein the step of converting includes digitizing the magnetic resonance signal into a plurality of digital data values each having a digital real component and a digital imaginary component, the series of data values being the reference view.

4. The method as set forth in claim 3 wherein the step of deriving the reference view further includes averaging a plurality of views each encoded with the reference phase encoding.

5. The method as set forth in claim 1 wherein the step of deriving the reference view includes combining a plurality of the monitor views to create the reference view.

6. The method as set forth in claim 1 further including before the comparing step, fourier transforming the monitor and reference views such that the comparing step compares fourier transformed views.

7. The method as set forth in claim 1 wherein:
the reference view is a series of digital data values each having digital real and imaginary components;
each monitor view is a series of digital data values each having digital real and imaginary components; and,
the comparing step includes determining a deviation between corresponding real and imaginary components of the digital data values of the monitor and reference views.

8. The method as set forth in claim 7 further including determining whether the deviation between the monitor and reference view is within a selected deviation range.

9. The method as set forth in claim 8 further including selectively accepting and rejecting each image view in accordance with whether the deviation between the reference view and the corresponding monitor view is within the selected range.

10. The method as set forth in claim 8 further including collecting a plurality of image views corresponding to each of the plurality of image phase encodings.

11. The method as set forth in claim 10 further including for each image phase encoding, selecting a one of the plurality of image views whose corresponding monitor view has the least deviation from the reference view.

12. The method as set forth in claim 10 further including for each image phase encoding, averaging each of the image views whose corresponding monitor view is within the preselected range of the reference view.

13. The method as set forth in claim 10 further including for each image phase encoding, in response to the deviation between the monitor and reference views being outside the selected range, repeating the resonance excitation and data collection pulse sequence with the same image phase encoding.

14. The method as set forth in claim 10 further including for each image phase encoding, in response to the deviation between the monitor and reference views being outside of the selected range, interpolating image views with similar but different phase encodings.

15. A method of medical diagnostic imaging comprising:
disposing a selected portion of a subject in an image region;
non-invasively examining the subject to derive a plurality of pairs of digital electronic monitor and image views, each pair being collected generally contemporaneously in time;
comparing each monitor view with a reference view to determine a degree of deviation therebetween;
in accordance with the determined deviation selectively accepting and rejecting the generally concurrently taken image view; and,
processing the accepted image views into an image representation.

16. A magnetic resonance imaging apparatus comprising:
main magnetic field means for producing a generally uniform main magnetic field through an image region;
a gradient field means for selectively applying magnetic field gradients across the main magnetic field in the image region;
an RF means for selectively producing radio frequency pulses for exciting magnetic resonance and manipulating a magnetization of the excited resonance;,
a receiving means for receiving magnetic resonance signals from the image region;
a reference view memory means operatively connected with the receiving means for storing a reference view;
a monitor view memory means operatively connected with the receiving means for storing a monitor view;
an image view memory means operatively connected with the receiving means for storing image views;
a deviation determining means operatively connected with the reference and monitor view memory means for determining a deviation between corresponding reference and monitor views; and,
a timing and control means operatively connected with the gradient field means and the RF means for selectively causing the excitation of magnetic resonance, the phase encoding of magnetic resonance with a reference phase encode gradient, phase encoding of the magnetic resonance with each of a selected plurality of image phase encodings, and selectively applying the magnetic field gradients and RF signals to generate a plurality of paired monitor and image views, the monitor view being phase encoded with the reference phase encoding and the image view being phase encoded with one of the preselected plurality of image phase encodings.

17. The apparatus as set forth in claim 16 wherein the comparing means is operatively connected with the timing and control means for causing the timing and control means to repeat the generation of a monitor and image view pair in response to the corresponding monitor view deviating from the reference view by more than a preselected tolerance.

18. The apparatus as set forth in claim 16 further including:
an image view processing means for processing and passing selected image views from the image view memory to a transform means, the processing means being operatively connected with the deviation determining means;
the transform means transforming the processed image views into an image representation for storage in an image memory.

19. The apparatus as set forth in claim 18 wherein the image view processing means includes at least one of:

a means for selectively transferring or discarding an image view,
an averaging means for selectively averaging a plurality of like image views, and,
an interpolating means for interpolating adjacent image views to replace an unacceptable view.

20. The apparatus as set forth in claim 18 wherein the image view memory means includes first and second image view memory means, each for storing at least two complete sets of image views.

21. The apparatus as set forth in claim 20 wherein the comparing means compares the monitor views that correspond to image views with the same phase encoding with the reference view to determine which matches more closely and wherein the image view processing means processes the image view corresponding to the more clearly matching monitor view.

* * * * *